United States Patent
Takagi

[11] Patent Number: 6,150,727
[45] Date of Patent: *Nov. 21, 2000

[54] SEMICONDUCTOR DEVICE

[75] Inventor: Ryouichi Takagi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/714,384

[22] Filed: Sep. 16, 1996

[30] Foreign Application Priority Data

Mar. 12, 1996 [JP] Japan ................. 8-054493

[51] Int. Cl.$^7$ ............................ H01L 23/48
[52] U.S. Cl. ............. 257/786; 257/737; 257/667; 257/774
[58] Field of Search ................. 257/786, 737, 257/667, 774

[56] References Cited

U.S. PATENT DOCUMENTS

| | | | |
|---|---|---|---|
| 4,841,354 | 6/1989 | Inaba | 357/71 |
| 5,216,280 | 6/1993 | Tanaka et al. | 257/784 |
| 5,404,045 | 4/1995 | Mizushima | 257/786 |
| 5,629,550 | 5/1997 | Mita et al. | 257/435 |
| 5,701,031 | 12/1997 | Oguchi et al. | 257/786 |
| 5,796,171 | 8/1998 | Koc et al. | 257/786 |

FOREIGN PATENT DOCUMENTS

| | | |
|---|---|---|
| 4-316337 | 11/1992 | Japan . |
| 5-29377 | 2/1993 | Japan . |
| 406077223A | 3/1994 | Japan .................. 257/786 |

Primary Examiner—Leo P. Picard
Assistant Examiner—Hung Van Duong
Attorney, Agent, or Firm—Burns, Doane, Swecker & Mathis, LLP

[57] ABSTRACT

To provide a substantially flat surface, a semiconductor device includes a first insulating film formed on one main surface of a semiconductor substrate, and a first lead layer buried in the first insulating film. A first bonding pad is formed in contact with the first lead layer. A second insulating film is formed on the first insulating film and the first lead layer. A second lead layer is formed on the second insulating film, and a second bonding pad includes part of the second lead layer. The height of the surface of the second lead layer is substantially equal to the height of the surface of the first bonding pad respectively from the one main surface of the semiconductor substrate. The first lead layer can be formed on the first insulating film in which case the second insulating film is formed on the first insulating film and the first lead layer such that a first bonding pad is buried in part in the second insulating film in contact with the first lead layer and is exposed in part out of the second insulating film. A second lead layer is formed on the second insulating film, and a height of a top surface of the second lead layer is substantially equal to a height of a top surface of the first bonding pad. A second bonding pad is constituted by part of the second lead layer. The first lead layer and the second lead layer can overlap each other at least in part via the second insulating film.

12 Claims, 6 Drawing Sheets

SEMICONDUCTOR DEVICE

BACKGROUND OF THE INVENTION

1) Field of the Invention

The present invention relates to a structure of a semiconductor device, and more particularly to a structure of a bonding pad in a semiconductor device.

2) Description of the Prior Art

FIG. 8 is a plan view and FIG. 9 is a sectional view of a conventional semiconductor device. Both are enlarged views particularly showing a region having bonding pads in a semiconductor device (see for example, Japanese Patent Application Laid-Open No. 5-29377). In these Figures, the semiconductor device includes a semiconductor substrate 101, an insulating film 102 deposited on the semiconductor substrate 101, a plurality of lead conductors 103 disposed on the insulating film 102 at equal intervals, an interlayer insulating film 104 deposited on the insulating film 102 and the leads 103, a plurality of lower electrode pads 105 electrically connected to respective leads 103, and a plurality of upper electrode pads 106 respectively deposited on the lower electrode pads 105 through respective through holes and having larger surface areas than the lower electrode pads 105, and a passivation film 107.

As seen in FIG. 8, there are disposed outer circumferential pads 108 formed at the area nearest to the edge, i.e., the outer circumference, of the semiconductor chip, and inner circumferential pads 109 formed on the inner circumference. The inner circumferential pads 109 are disposed and formed at equal intervals of a given pitch. The pitch of the inner circumferential pads 109 is equal to the sum of the width of a lead, e.g., 103a and of one pad, by way of the lead connected to one of the outer circumferential pads 108.

Further, FIGS. 10 and 11 show a structure of another conventional bonding pad of a semiconductor device (see for example, Japanese Patent Application Laid-Open No. 4-316337). As with the aforementioned prior art, on the outer and inner circumferences along the edge of a semiconductor substrate 101, outer and inner circumferential pads 108 and 109 are disposed at equal intervals in zigzag fashion. While the outer circumferential pads 108 are disposed and formed on the semiconductor substrate 101, the inner circumferential pads 109 are disposed and formed on the insulating films 102a and 102b deposited on the semiconductor substrate 101. As seen from the sectional view of FIG. 11, the surface of the outer circumferential pad 108 and the surface of the inner circumferential pad 109 differ from each other in height.

In the semiconductor device with pads thus disposed and formed, a plurality of arrays of pads are disposed and formed in a zigzag fashion along the edge of the semiconductor chip. Thus, the pad pitch is effectively reduced.

However, as seen from the layout of the conventional semiconductor device as shown in FIG. 8 and 9, the surfaces of the upper electrode pads 106 in the outer and inner circumferential pads 108 and 109 are not flat due to the unevenness on the surface of the lower layer. Therefore, pads may be cracked by a bonding pressure and the lower metal lead may also be cracked or broken by the stress applied to the lower lead. Thus, there is a problem with reliability.

Also, as seen from the layout of the conventional semiconductor device shown in FIGS. 10 and 11, the heights of the inner and outer circumferential pads 109 and 108 differ from each other. Therefore, the setting of the height of a bonder must be made with respect to the layout of the pads at the time of bonding. Thus, there is the problem that the number of processes, manufacturing cost, and processing time are increased.

SUMMARY OF THE INVENTION

A purpose of the present invention is to solve the aforementioned problems and to provide a semiconductor device having a structure of bonding pads with a flat surface to facilitate the process of bonding.

According to one aspect of the present invention, the semiconductor device comprises a first insulating film formed on one main surface of a semiconductor substrate, and a first lead layer buried in the first insulating film. A first bonding pad is formed in contact with the first lead layer. A second insulating film is formed on the first insulating film and the first lead layer. A second lead layer is formed on the second insulating film, and a second bonding pad includes part of the second lead layer. The height of the surface of the second lead layer is substantially equal to the height of the surface of the first bonding pad respectively from the one main surface of the semiconductor substrate.

According to another aspect of the present invention, the semiconductor device comprises a first insulating film formed on one main surface of a semiconductor substrate and a first lead layer formed on the first insulating film. A second insulating film is formed on the first insulating film and the first lead layer. A first bonding pad is buried in part in the second insulating film in contact with the first lead layer and is exposed in part out of the second insulating film. A second lead layer is formed on the second insulating film, and a height of a top surface of the second lead layer is substantially equal to a height of a top surface of the first bonding pad. A second bonding pad is constituted by part of the second lead layer. The first lead layer and the second lead layer overlap each other at least in part via the second insulating film.

In another aspect of the present invention, in the semiconductor device, the second lead layer is formed on an upper layer above the first lead layer via the second insulating film, and the first lead layer and the second lead layer overlap each other at least in part.

In another aspect of the present invention, in the semiconductor device, the first and second bonding pads are disposed in a zigzag fashion.

In another aspect of the present invention, in the semiconductor device, the first and second bonding pads are formed on a same line on which the first and second lead layers extend.

In another aspect of the present invention, in the semiconductor device, the first and second insulating layers include an insulating material having a Poisson's ratio of 1 Gpa through 50 Gpa.

In another aspect of the present invention, in the semiconductor device, the first insulating film and the second insulating film are constituted by polyimide.

Other features and advantages of the present invention will become more apparent from the following description taken together with the accompanying drawings.

DESCRIPTION OF THE PREFERRED EMBODIMENTS

Preferred embodiments of the present invention will hereinafter be described in detail with reference to the accompanying drawings.

The First Embodiment

Figure 1:
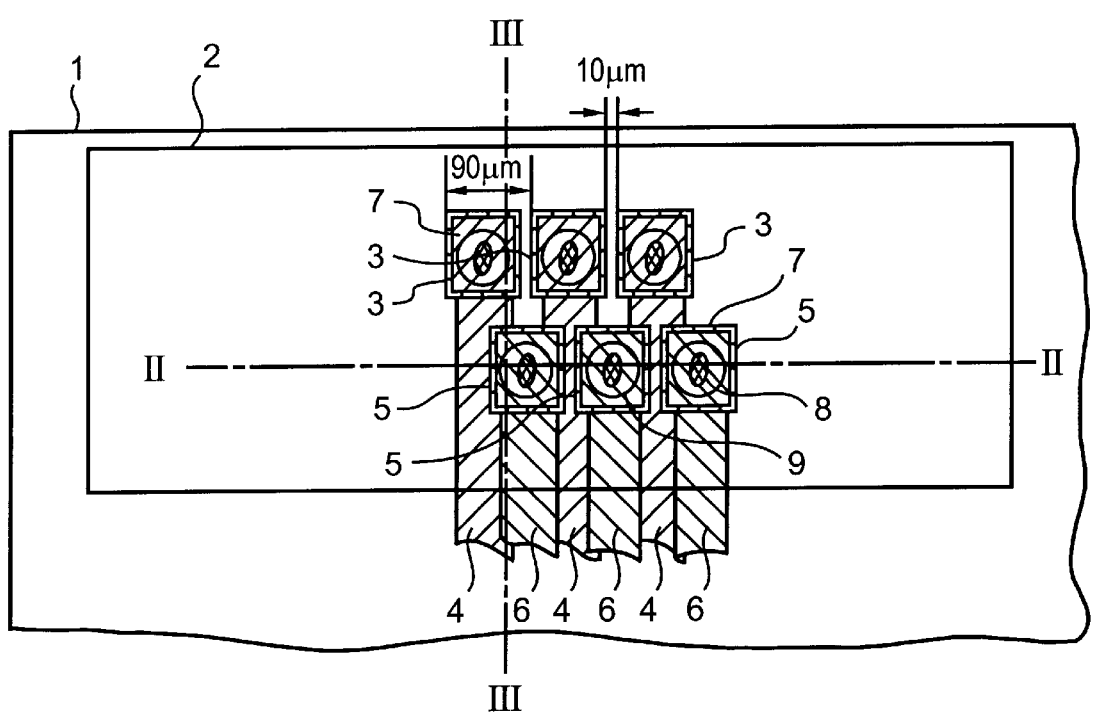
FIG. 1 illustrates a plan view of a bonding pad of a semiconductor device according to a first embodiment of the present invention.
Figure 2:
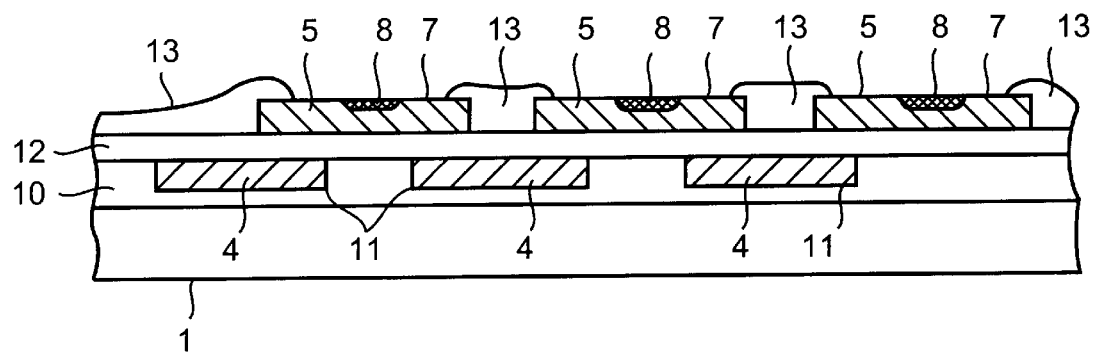
FIG. 2 illustrates a cross sectional view of the structure of a bonding pad taken along the line II—II in FIG. 1.
Figure 3:
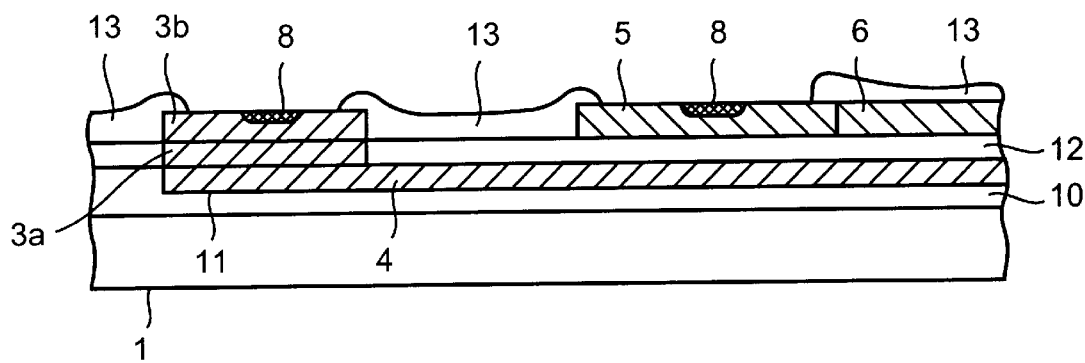
FIG. 3 illustrates a cross sectional view of the structure of a bonding pad taken along the line III—III in FIG. 1.

FIGS. 1 to 3 illustrate a structure of a bonding pad of a semiconductor device according to a first embodiment of the present invention.

In FIG. 1, the semiconductor device includes a semiconductor substrate 1, and a bonding-pad formation region 2 on the semiconductor substrate 1. First bonding pads 3 are formed within the bonding-pad formation region 2 and are disposed at intervals of substantially the same pitch. The first bonding pads 3 are composed of conductive films and each surface is exposed. First leads 4, made of aluminum, are connected to the first bonding pads 3 and extend in one direction.

Further, a plurality of second bonding pads 5 are disposed in a line parallel to a line of the first bonding pads 3. Second leads 6, made of metal such as aluminum, are connected to the second bonding pads 5 and extend in one direction. As evident in FIG. 1, a line of the first bonding pads 3 are formed nearer to the edge, i.e., outer circumference, of the semiconductor substrate 1 than the line of the second bonding pads 5, and the second bonding pads 5 are formed in the inner circumference of the semiconductor substrate 1.

Furthermore, the first and second bonding pads 3 and 5 includes the exposed surface regions 7. A passivation film 13 is formed on the region other than the exposed regions 7 of the bonding pads, that is, on the vicinities of the outer circumferences of the bonding pads. The first and second bonding pads 3 and 5 includes traces 8 of a probe needle that is pressed when a probe needle is put to the semiconductor device for measuring the electric characteristics of the device. The connecting position 9 on the exposed surface of the first bonding pad 3 or the second bonding pad 5 shows an area where a bonding lead is connected.

As evident in the plan view of FIG. 1, the first leads 4 are disposed at pitches of equal distance, and the second leads 6 are disposed also at pitches of equal distance. On both sides of a given first lead 4, second leads 6 are disposed and formed in parallel, and the first lead 4 and the second leads overlap in part each other at the respective sides. Further, the second bonding pad 5 comprises an integral part of the second lead 6, and overlap the first lead 4 at least in part or for the most part.

FIG. 2 illustrates a cross sectional view of the structure of a bonding pad taken along the line II—II in FIG. 1.

As shown in the figure, a first insulating film 10 is formed, for instance by deposition, on the main surface of the semiconductor substrate 1. A groove 11 is formed in such that the depth from the surface of the first insulating film is about 0.5 μm and the width is in a range of about 40 μm through 80 μm. The first lead 4 is buried in the groove 11, and the height of the surface of the first lead 4 is nearly the same as that of the first insulating film 10. A second insulating film 12 is formed, for instance by deposition, on the aforementioned first insulating film 10 and the first leads 4. A passivation film 13, composed of either SiN, $SiO_2$, or polyimide, is deposited on the outermost surface of the semiconductor device for protecting the semiconductor device. This passivation film 13 is formed on the region other than the first and second bonding pads 3 and 5 and on the circumferential edges of the bonding pads 3 and 5.

FIG. 3 illustrates a cross sectional view of the structure of a bonding pad taken along the line III—III in FIG. 1. This is a sectional view taken in parallel to the direction in which the first and second leads 4 and 6 extend. In FIG. 3, the same reference numerals as those applied to FIGS. 1 and 2 represent the same or corresponding parts. As shown in FIG. 3, the height of the surface of the first bonding pad 3, formed on the upper portion of the first lead 4, is identical with that of the second bonding pad 5 integrally constituted with the second lead 6. In addition, the groove 11 is formed in the first insulating film 10, and the first lead 4 made of metal or alloy conductor such as aluminum is buried in the groove 11. Therefore, the step structure of the prior art is eliminated on the surface of the first insulating film 10 caused by the formation of the first lead 4.

Next, a method of manufacturing the semiconductor device shown in FIGS. 1 through 3 will be described.

In the beginning, the first insulating film 10, such as a silicon oxide film, is deposited on the semiconductor substrate 1 such that the thickness of the film 10 becomes 1.0 μm through 1.5 μm, for example. Then, an etching mask having a plurality of punched patterns of the shape of the first lead 4 at pitches (intervals) of, e.g., 90 μm is formed on the first insulating film 10, and anisotropically etched so that the grooves 11 with a depth of, e.g., 0.5 μm and a width of 40 μm through 80 μm are formed. Thereafter, the etching mask is removed. At the location where the groove 11 is formed therein, the first insulating film is etched so that its thickness comes into the range of 0.5 μm through 1.0 μm, for example.

Thus, the dimension of the first lead 4 is determined by the dimension of the groove 11 formed in the first insulating film 10. For example, in a case where the first lead is formed for taking in an electric potential of ground or a power supply, the width of the groove 11 can be made wide, e.g., to around 80 μm, and in other cases, the minimum width of the groove 11 can be as low as about 40 μm. In addition, the depth of the groove 11 can be about 10% larger than the thickness of the first lead 4 to be formed in the groove 11.

Next, a conductive substance such as polycrystalline silicon is deposited into the groove 11 by sputter deposition or chemical vapor deposition (CVD), and then only the conductive substance in the groove 11 is left by selective etching process, so that the first lead 4 with substantially the same dimension as that of the groove 11 is formed. Thereafter, the second insulating film 12 composed of a silicon oxide film is deposited on the first insulating film 10 and the first lead 4.

Next, an etching pattern having the punched shapes of the first bonding pads 3 is formed on the second insulating film 12, and anisotropic etching is performed until the surface of the first lead 4 is exposed. A conductive substance is placed in the groove 11 formed by the anisotropic etching to form a conductive layer 3a (as shown in FIG. 3). Thereafter, the etching pattern is removed.

Next, the second lead 6 composed of aluminum is patterned on the second insulating film 12 at a predetermined dimension, and the conductive layer 3b is also formed on the conductive layer 3a. Here, the size of the second lead 6 may be substantially the same or may be different with the size of the first lead 4. The end region of the second lead 6 is formed into a second bonding pad 5 as seen in a plan view of FIG. 1 and cross sectional view of FIG. 3, therefore the shape of the second lead 6 is formed so as to have a pad region of 80 μm wide at its end, for example.

Alternatively, the first bonding pad 3 described above may be formed as follows. After the formation of the second lead 6, part of the second insulating film 12 is selectively removed so that a groove of, e.g., 80 μm wide is formed and the end region of the first lead 4 is exposed. Thereafter, a conductive substance is selectively deposited into and on the groove to obtain the first bonding pad 3 composed of the conductive substance 3a and 3b. This first bonding pad 3 is formed so that the height of the surface thereof becomes substantially equal to the height of the second bonding pad 5.

Furthermore, on the outermost surface, the passivation film 13 is disposed on the region other than the regions of the bonding pads. As one of the methods of forming the passivation film 13, a lift-off method may be used. A resist pattern is formed on the region where the bonding pads are finally exposed, and then a passivation film such as either of an oxide film, silicon nitride film or polyimide film, is deposited over the entire surface of the semiconductor device. Thereafter, by removing the resist pattern and the passivation film deposited on the resist pattern by the lift-off method, a passivation film 13 such as shown in FIGS. 2 and 3 is formed.

The passivation is not limited to the lift-off method but any method may be used as far as the semiconductor device can be protected and also the surface of the bonding pad can be exposed by a predetermined size. In addition, $SiO_2$ film may be preferably used for passivation.

The peripheral regions of about 5 μm from the outer circumferences of the first and second bonding pads 3 and 5 are covered with the passivation film 13, so that the exposed width of the first and second bonding pads 3 and 5 becomes about 70 μm, for example. The pads thus formed, as shown in FIG. 1, is sized so that putting of a probe needle to a bonding pad is easy, and bonding can be sufficiently performed.

Also, the second insulating film 12 has a film thickness which can stand the pressure (e.g., 10 g weight/20 μm φ) of the needle of a probe which is put to the bonding pad, and the pressure (30 g weight/60 μm φ) which is applied in lead bonding. For example, if the second insulating film 12 has a thickness of 0.5 μm through 1.0 μm, there will be no damage to the semiconductor device in the measurement of electric characteristics after manufacturing of the semiconductor device and in connecting a lead to the bonding pad.

In the aforementioned manufacturing method, the second insulating layer 12 is formed and then the conductive layer 3a is formed in the second insulating layer 12 in contact with the first lead 4. Thereafter, at the same time the conductive layer 3b is formed on the conductive layer 3a, the second lead 6 is formed. But, the first bonding pad 3 is not always constituted by a multi-layer structure comprising the conductive layers 3a and 3b, but the pad 3 may be constructed by a single layer. In addition, if the structure of the semiconductor device is finally obtained as shown in FIGS. 1 through 3, the order of manufacturing processes may be altered, and the bonding pad may be comprised of a single layer or a multi-layer structure.

In the semiconductor device shown in FIGS. 1 through 3, the height of the surface of the first bonding pad 3 formed along the outer circumference of the chip of the semiconductor device is nearly same with the height of the second bonding pad 5 formed in the inner circumference. Therefore, the probe needles can be put to the bonding pads at the same time with uniform pressure to all of the bonding pads. In addition, setting of a bonder for attaching a lead to the bonding pad is performed easily, and a reduction in the load of the setting is obtained, because the heights of the bonding pads are uniform.

Although the height of first bonding pad 3 and the height of the second bonding pad 5 are made substantially equal in this embodiment, the difference of the height within a few micro-meter (μm), preferably within 2 μm, is tolerable to put a probe needle or to set a bonder. However, as understood from the description, far less difference of the height is attained in this embodiment.

Also, if the width of the exposed surface of the bonding pad is set to 70 μm for example, so that putting a probe needle in contact with a bonding pad and lead bonding can be sufficiently performed, and the space between bonding pads were set to, e.g., 10 μm, then the outer circumferential bonding pads can be disposed at pitches (intervals) of 90 μm, for example. In addition, the inner circumferential bonding pads can also be disposed at pitches (intervals) of, e.g., 90 μm by disposing the second inner circumferential bonding pads 5 and the second lead 6 connected to the pad 5 so that they are superimposed on the first lead 4. Therefore, the density of the bonding pads can be enhanced as compared with that of the conventional semiconductor device.

In the example shown in FIGS. 1 through 3, if two rows of the first and second bonding pads 3 and 5 are respectively disposed at pitches (intervals) of 90 μm, and in zigzag fashion each other, then a total of 800 pins (pads) can be formed in a chip of 9 mm square.

Also, the bonding pads 3 and 5 are both formed on the layer whose surface is flat, so that the flatness of the bonding pads is enhanced. Even in a case where pressure is applied to the bonding pads, for example, by putting the probe needle to the pads, damage such as a pad cracking can be suppressed, and therefore a stable structure is obtained.

In addition, the shape of the bonding pads can be varied in the outer and inner circumferences, and pitches of the first and second bonding pads may be varied. Accordingly, the lead pitch and the lead width can be varied as compared with the example in the first embodiment shown in FIGS. 1 through 3. Also, in this embodiment, the second bonding pad 5 consists of the conductive film which is continuous with the second lead 6, and part of the second lead 6 constitutes the second bonding pad 5. However, the second bonding pad 5 and the second lead 6 may be separately formed with the second bonding pad 5 overlapping on the first lead 4.

The Second Embodiment

Figure 4:
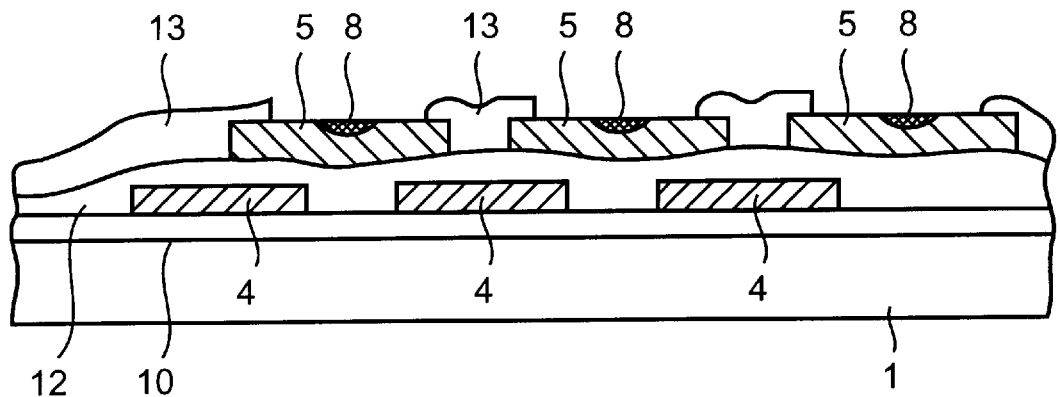
FIG. 4 illustrate a cross sectional view of a structure of a bonding pad of a semiconductor device according to a second embodiment of the present invention.

FIGS. 4 illustrate a cross sectional view of a structure of a bonding pad of a semiconductor device according to a second embodiment of the present invention. A plan view of the second embodiment is the same as FIG. 1 of the first embodiment.

Next, a second embodiment of the present invention will be described with reference to FIG. 4. In the figure, the same reference numerals as those applied to FIGS. 1 through 3 already used in the above description will represent the same or corresponding parts.

The point of difference between the structure of the semiconductor device of this embodiment and the structure of the semiconductor device of the aforementioned first embodiment is that, while in the first embodiment the first lead 4 has been buried and formed in the groove 11 formed in the first insulating film 10, in the second embodiment the first lead 4 is deposited directly on the flat surface of the first insulating film 10.

A manufacturing method is identical with that of the first embodiment, except that the first lead 4 is patterned on the first insulating film 10 whose surface is flat, instead of forming the groove 11 in the first insulating film 10 after the first insulating film 10 is deposited.

Thus, the second embodiment, as with the first embodiment, can reduce the pitch between the bonding pads with a less number of manufacturing processes and form a highly integrated semiconductor device with a lower number of process steps compared to the prior art. With this, a chip area can be reduced.

The Third Embodiment

Figure 5:
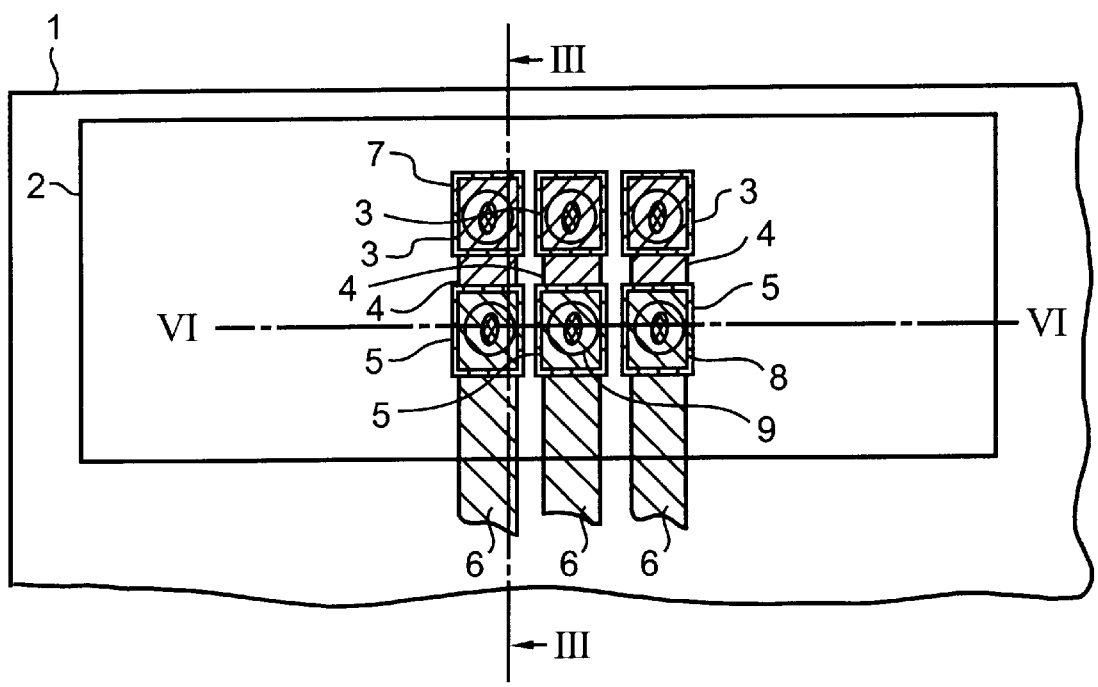
FIG. 5 illustrates a plan view of a bonding pad of a semiconductor device according to a third embodiment of the present invention.
Figure 6:
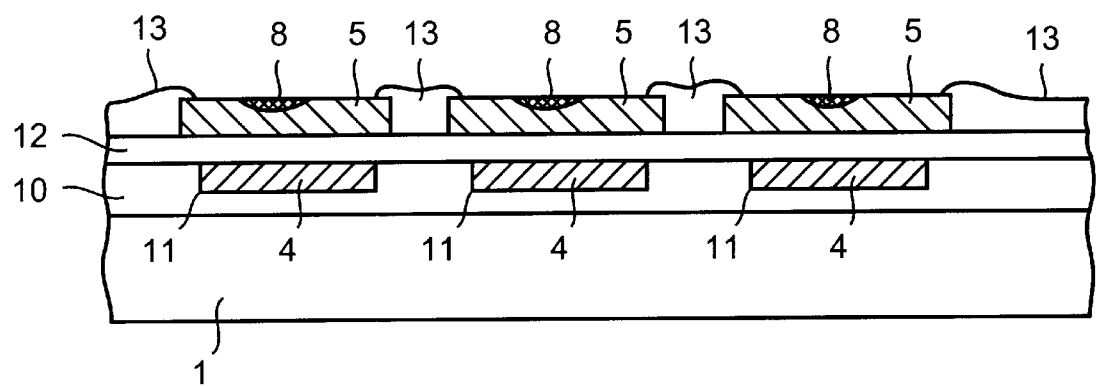
FIG. 6 illustrates a cross sectional view of the structure of a bonding pad taken along the line VI—VI in FIG. 5.

FIGS. 5 and 6 illustrate a structure of a bonding pad of a semiconductor device according to a third embodiment of the present invention.

A third embodiment of the present invention will next be described with reference to FIG. 5 and 6. FIG. 5 is an enlarged plan view of a semiconductor device particularly showing a bonding-pad formation region 2, and FIG. 6 is a cross sectional view taken along the line VI—VI in FIG. 5. A cross sectional view taken along the line III—III in FIG. 5 is same with FIG. 3. In the figures, the same reference numerals as those applied to FIG. 1 through 3 represent the same or corresponding parts.

The difference in structure between the third embodiment and the aforementioned first embodiment is as follows. In the first embodiment, the first bonding pads 3 and the second bonding pads 5 are disposed in a zigzag fashion, as shown in FIG. 1. Therefore, a second lead 6 is disposed between two first leads 4 so that part of the second lead 6 overlaps the first leads 4. In the third embodiment, the first bonding pad 3 on the outer circumference of the semiconductor device and the second bonding pad 5 on the inner circumference are disposed on the same line in the direction in which the leads extend. The second bonding pad 5 is formed above the first lead 4 and the second lead 6 is formed directly above the first lead 4 via a second insulating film 12.

As seen in the cross sectional view of FIG. 6, the first lead 4 and the second bonding pad 5 are disposed so that they are superimposed with each other via the second insulating film 12. Because the second insulating film 12 has a thickness of 0.5 μm through 1.0 μm, for example, which is sufficient for insulation, there is no possibility that the first lead 4 and the second bonding pad 5 are electrically influenced with each other. It may possible that the widths of the first and second leads 4 and 6 differ from each other, depending upon devices which are connected to the first and second leads 4 and 6. In such a case, the widths of the first and second leads 4 and 6 may differ from that shown in FIG. 6.

Even in the semiconductor device thus formed, as with the first embodiment, the heights of the surfaces of the first and second bonding pads 3 and 5 are the same. In addition, as with the first embodiment, the setting of the height of the bonder is simplified when lead bonding is performed, and the needle pressure becomes uniform when the probe needle is put to the bonding pad.

Additionally, the pitch between the bonding pads can be made substantially equal to that of the first embodiment. Thus, a highly integrated semiconductor device can be obtained. Alternatively, the pitches of the bonding pads 3 and 5 may be varied respectively.

Furthermore, because the first lead 4 is formed in the groove formed in the first insulating film 10, the second lead 6 and the second bonding pad 5 can be made flat, so that the damage may be reduced or eliminated such as a pad cracking even when pressure is applied to the bonding pad.

Moreover, even in the case where the first leads 4 are patterned on the flat first insulating film 10 without forming a groove therein as in the second embodiment, the first and second leads 4 and 6 can be superimposed as described above, and the same effect can be obtained.

The Fourth Embodiment

Figure 7:
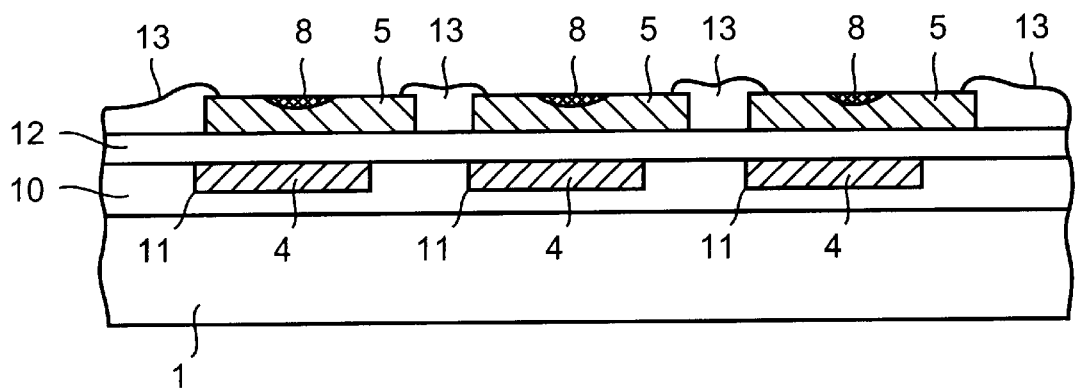
FIG. 7 illustrates a structure of a bonding pad of a semiconductor device according to a fourth embodiment of the present invention.
Figure 8:
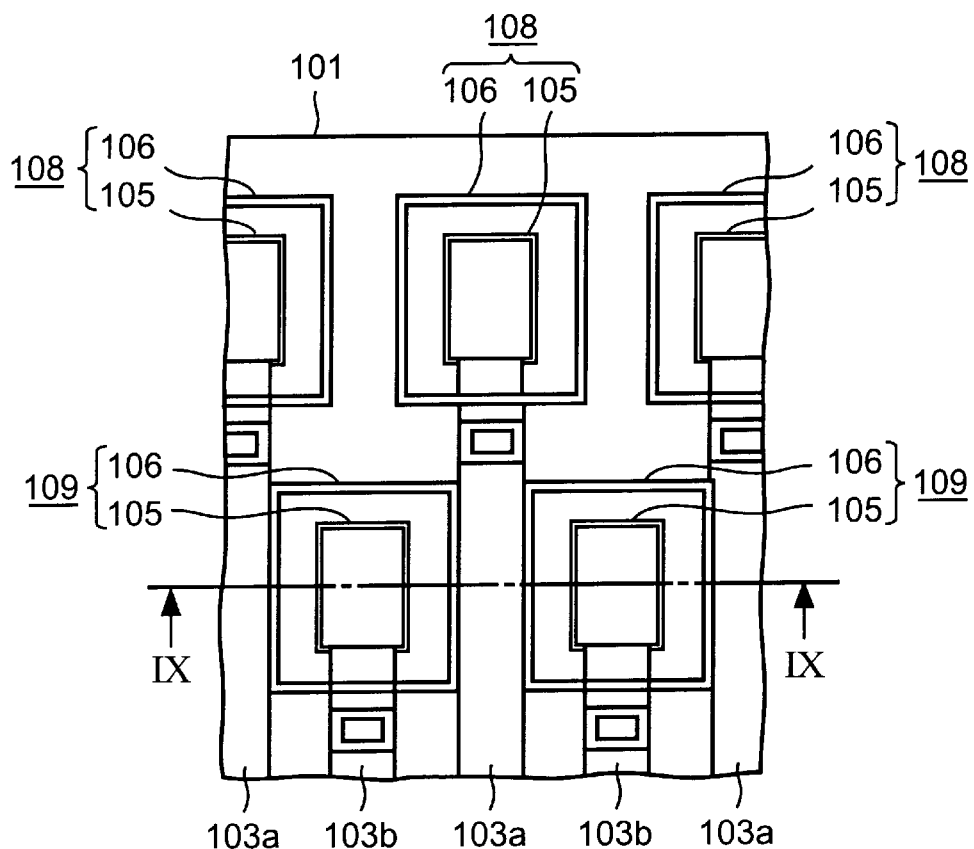
FIG. 8 is a plan view showing a structure of bonding pads of a conventional semiconductor device.
Figure 9:
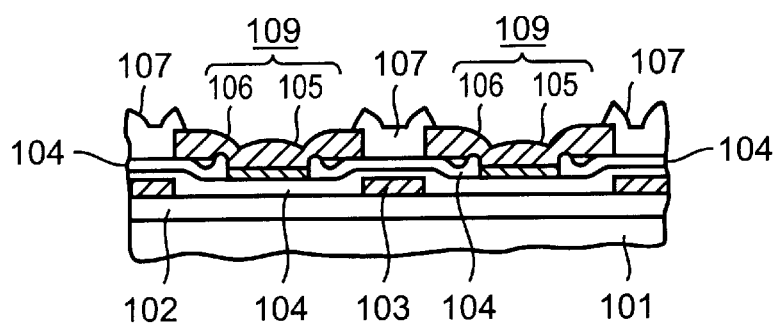
FIG. 9 is a sectional view showing a structure of bonding pads of a conventional semiconductor device taken along the line IX—IX in FIG. 8.
Figure 10:
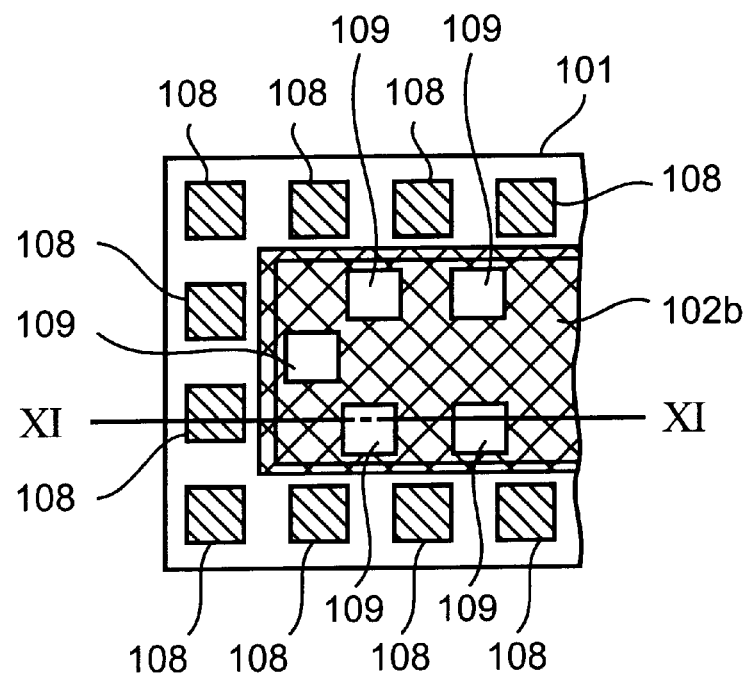
FIG. 10 is a plan view showing another structure of bonding pads of a conventional semiconductor device.
Figure 11:
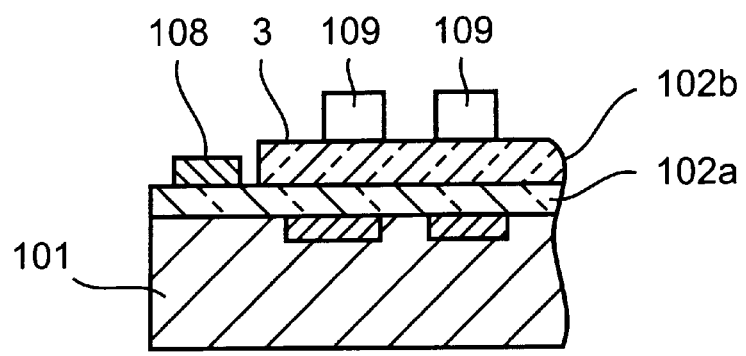
FIG. 11 is a sectional view showing another structure of bonding pads of a conventional semiconductor device taken along the line XI—XI in FIG. 10.

FIGS. 7 illustrates a structure of a bonding pad of a semiconductor device according to a fourth embodiment of the present invention. A fourth embodiment of the present invention will next be described.

In the first and third embodiments, a description has been made of cases where the offset between the first and second bonding pads 3 and 5 is one half the pitch or zero, while in this embodiment a description will be made of a case where the offset between the first and second bonding pads is less than one half the pitch.

As an example of the fourth embodiment, in FIG. 7, there is shown a cross sectional view of a bonding pad taken along a line corresponding to the line II—II in the plan view of FIG. 1. In this embodiment, the pitch in a row of the first bonding pads 3 and the pitch in a row of the second bonding pads 5 are substantially the same, and the offset between the first and second leads 4 and 6 is less than one half the pitch.

Even when the offset between the first and second leads 4 and 6 is less than one half the pitch, the first lead 4 may be buried in the first insulating film 10, and the first and second bonding pads 3 and 5 may be formed so that the heights of the respective surfaces become substantially the same. Thus, a structure where the second bonding pad 5 and the second lead 6 are made flat is obtained. Therefore, even in the semiconductor device formed in this way, the burden for setting a bonder may be reduced, the pressure of a probe needle with respect to the bonding pad may be made uniform, and cracking of pads may be suppressed.

In addition, as shown in the second embodiment, even in a case where the first lead 4 is formed not being buried in the first insulating film 10, the advantages may be obtained that setting of the bonder becomes easier, the pressure of the probe needle becomes uniform with respect to the bonding pad, and a pad cracking is suppressed.

The Fifth Embodiment

A fifth embodiment of the present invention will next be described. The structure of the semiconductor device of this embodiment is identical with the aforementioned first through fourth embodiments, except for the material of the first insulating film 10 and the second insulating film 12. In the first through fourth embodiments, the first and second insulating films 10 and 12 are formed from a comparatively hard material such as a silicon oxide film. In contrast, this fifth embodiment is characterized in that either or both of the first and second insulating films 10 and 12 are formed from a soft material such as polyimide.

While, in the structure of the semiconductor device of the fifth embodiment, polyimide is shown as an example of the material constituting the first and second insulating films 10 and 12, a criterion for the softness of this material can be represented by a Poisson's ratio. If the material has an insulating character and has a Poisson's ratio of 1 Gpa through 50 Gpa, then the material may be used. The Poisson's ratio of the polyimide, shown as an example of the insulating film, is about 3 Gpa.

By forming a flat structure of a semiconductor device in which the height of the surfaces of the first and second bonding pads 3 and 5 are uniform, and further by forming the first and second insulating films 10 and 12 with a soft material, the pressure of the needle of a probe (10 g weight/20 $\mu$m $\phi$) which is put to the first and second bonding pads 3 and 5 may be damped or dissipated, and the pressure which is applied in lead bonding (30 g weight/60 $\mu$m $\phi$) may be damped. Consequently, there is the advantage that the load to be applied to devices can be damped, and damages to devices such as a pad cracking can be further suppressed.

The present invention is constructed and embodied in various way as described above, and has the following advantages.

A groove is formed in the first insulating film flatly formed or deposited on the semiconductor substrate, and the first lead is buried and formed in the groove. Furthermore, the second lead is formed on the first lead via the second insulating film. The height of the surface of the first bonding pad, formed on and in contact with the first lead, is made equal to the height of the second bonding pad formed as part of the second lead. With this structure, there is the advantage that the burden of setting the bonder is reduced in performing a bonding operation with respect to the bonding pads. In addition, the step portion between the first and second lead is eliminated and therefore the second lead and the second bonding pad can be flatly formed.

In addition, the heights of the surfaces of the first and second bonding pads formed on the semiconductor substrate are made substantially equal to each other, and the first and second leads are disposed and formed so that they overlap each other at least in part via the second insulating film. With this structure, in addition to the aforementioned advantage, there is the advantage that a high integration in the semiconductor device becomes possible.

Furthermore, even in a case where the first and second leads are disposed so that they do not overlap each other in part, there is the advantage that the burden of setting the bonder is reduced in performing a bonding operation with respect to the bonding pads, by making the height of the surface of the first bonding pad equal to that of the second bonding pad formed as part of the second lead. In addition to this advantage, the step portion between the first lead and the surface of the first insulating film is eliminated and therefore there is the advantage that the second lead and the second bonding pad can be flatly formed.

Additionally, it is possible to dispose the first bonding pad and the second bonding pad in a zigzag fashion. Even in this arrangement, there is the advantage that the burden of setting the bonder is reduced in performing a bonding operation with respect to the bonding pads by making the height of the surface of the first bonding pad equal to that of the second bonding pad formed as part of the second lead. In addition to this advantage, the step portion between the first lead and the surface of the first insulating film is eliminated and therefore there is the advantage that the second lead and the second bonding pad can be flatly formed.

Furthermore, even in the case where the first and second bonding pads are formed in a same line parallel to the leads, there is the advantage that the burden of setting the bonder is reduced in performing a bonding operation with respect to the bonding pads, by making the height of the surface of the first bonding pad substantially equal to that of the second bonding pad formed as part of the second lead. In addition to this advantage, the step portion between the first lead and the surface of the first insulating film is eliminated and therefore there is the advantage that the second lead and the second bonding pad can be flatly formed.

Moreover, by forming either or both of the materials constituting the first and second insulating films with an insulating material having a Poisson's ratio of 1 Gpa through 50 Gpa, both the pressure of the lead bonding and the pressure of the probe needle can be damped, and consequently, damage to devices can be further suppressed.

Finally, by constituting either or both of the first and second insulating films with polyimide having a Poisson's ratio of 3 Gpa, both the pressure of the lead bonding and the pressure of the probe needle can be damped, and consequently, damages to devices can be further suppressed.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A semiconductor device comprising:
    a first insulating film formed on one main surface of a semiconductor substrate;
    a first lead layer formed in said first insulating film;
    a first bonding pad formed in contact with said first lead layer;
    a second insulating film formed on said first insulating film and said first lead layer;
    a second lead layer formed on said second insulating film; and
    a second bonding pad constituted by part of said second lead layer,
    wherein said second lead layer is formed on an upper layer above said first lead layer with said second insulating film interposed therebetween, and said second lead layer overlaps at least two said first lead layers.

2. The semiconductor device as set forth in claim 1, wherein said first and second bonding pads are disposed in a zigzag fashion.

3. The semiconductor device as set forth in claim 1, wherein each of said first and second bonding pads are formed on a same line on which said first and second lead layers extend.

4. The semiconductor device as set forth in claim 1, wherein said first and second insulating films include insulating material having a Poisson's ratio of 1 Gpa through 50 Gpa.

5. The semiconductor device as set forth in claim 1, wherein said first insulating film and said second insulating film include polyimide.

6. The semiconductor device as set forth in claim 1, wherein each of the second leads lies above each gap of the neighboring first leads and overlaps on the neighboring first leads at both sides thereof.

7. A semiconductor device comprising:
    a first insulating film formed on one main surface of a semiconductor substrate;

a first lead layer formed on said first insulating film;

a second insulating film formed on said first insulating film and said first lead layer;

a first bonding pad buried in part in said second insulating film in contact with said first lead layer and exposed in part from said second insulating film;

a second lead layer formed on said second insulating film; and a second bonding pad constituted by part of said second lead layer, wherein said second lead layer is formed on an upper layer above said first lead layer with said second insulating film interposed therebetween, and wherein said second lead layer overlaps at least two said first lead layers.

8. The semiconductor device as set forth in claim 7, wherein said first and second bonding pads are disposed in a zigzag fashion.

9. The semiconductor device as set forth in claim 7, wherein each of said first and second bonding pads are formed on a same line on which said first and second lead layers extend.

10. The semiconductor device as set forth in claim 7, wherein said first and second insulating films include insulating material having a Poisson's ratio of 1 Gpa through 50 Gpa.

11. The semiconductor device as set forth in claim 7, wherein said first insulating film and said second insulating film include polyimide.

12. The semiconductor device as set forth in claim 7, wherein each of the second leads lies above each gap of the neighboring first leads and overlaps on the neighboring first leads at both sides thereof.

* * * * *